United States Patent
Bachar et al.

(10) Patent No.: US 10,251,302 B2
(45) Date of Patent: Apr. 2, 2019

(54) FLEXIBLE CHASSIS FOR INSTALLING ELECTRONIC EQUIPMENT IN A RACK

(71) Applicant: LinkedIn Corporation, Sunnyvale, CA (US)

(72) Inventors: Yuval Bachar, Sunnyvale, CA (US); Jacob R. Rose, San Jose, CA (US); Brad A. Peterson, San Jose, CA (US); Eric Wendorf, Elk Grove, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/708,310

(22) Filed: Sep. 19, 2017

(65) Prior Publication Data

US 2018/0368277 A1  Dec. 20, 2018

Related U.S. Application Data

(60) Provisional application No. 62/522,528, filed on Jun. 20, 2017.

(51) Int. Cl.
*H05K 7/14* (2006.01)
*H05K 7/18* (2006.01)

(52) U.S. Cl.
CPC ......... *H05K 7/1492* (2013.01); *H05K 7/1489* (2013.01); *H05K 7/18* (2013.01)

(58) Field of Classification Search
CPC .. H05K 7/1425; H05K 7/1487–7/1488; H05K 7/1489; H05K 7/1492
See application file for complete search history.

(56) References Cited

U.S. PATENT DOCUMENTS

| | | | | |
|---|---|---|---|---|
| 6,425,692 B1* | 7/2002 | Fujiwara | ............... | G02B 6/3897 385/56 |
| 6,469,899 B2* | 10/2002 | Hastings | ............... | H05K 7/1489 248/65 |
| 8,047,383 B2* | 11/2011 | Hendrix | ............... | H05K 7/1425 211/26 |
| 8,764,468 B1* | 7/2014 | Feroli | .................... | H01R 13/04 439/248 |
| 8,867,214 B2 | 10/2014 | Ross et al. | | |
| 8,982,565 B2* | 3/2015 | Sherrod | ............... | H05K 7/1488 248/155.5 |
| 9,167,726 B2* | 10/2015 | Pautsch | ............... | H05K 7/20836 |
| 9,867,309 B2* | 1/2018 | Su | ........................ | H05K 7/1489 |
| 2007/0095774 A1* | 5/2007 | Canfield | ................ | H05K 7/183 211/189 |

* cited by examiner

*Primary Examiner* — Zachary Pape
(74) *Attorney, Agent, or Firm* — Park, Vaughan, Fleming & Dowler LLP

(57) ABSTRACT

A flexible architecture for installing electronic equipment in a data center rack is provided, in the form of a virtual chassis. The virtual chassis simultaneously accepts multiple types of equipment items (e.g., computing devices, storage devices, communication devices) and/or multiple versions of a given type of equipment item, by altering the physical configuration of the chassis. As a result, cells or spaces of multiple different form-factors may be defined for receiving the equipment. Also, services such as data and power may be pre-attached to a virtual chassis so that when a computer server or other item is installed, it is automatically connected to the services without separate effort. One or more electronic equipment items, when installed in a cell of the chassis, may mate automatically with multiple data connectors and/or power connectors.

20 Claims, 8 Drawing Sheets

FLEXIBLE CHASSIS FOR INSTALLING ELECTRONIC EQUIPMENT IN A RACK

RELATED APPLICATION

This application claims priority to U.S. Provisional Patent Application No. 62/522,528, which was filed Jun. 20, 2017 and is incorporated herein by reference.

BACKGROUND

This disclosure relates to the field of data center architecture. More particularly, a flexible and modular chassis (e.g., a virtual chassis) is provided for installing electronic equipment in a rack.

In a typical data center, installation of a new rack of electronic equipment (e.g., computer servers, storage nodes, communication devices) involves identifying a desired configuration—such as how many servers, how many network switches, and so on—ahead of time, so that the entire rack can be assembled, then delivered to the data center, and finally installed.

One reason for this type of approach to populating a data center is that many rack systems are vendor-specific. In other words, most or all of the equipment to be installed in the rack is obtained from a single vendor, and the rack is configured in a proprietary manner so that it is compatible with the vendor's equipment, in terms of equipment dimensions, spacing between equipment items, the manner of attaching items to the rack, location and configuration of power and data cables, etc. A rack that has been or will be configured to accept one vendor's equipment may not be able to accept, or may not easily accept, equipment from another vendor. Limiting the contents of a given rack to what is offered by a single vendor limits flexibility and may require installation of another rack in order to contain equipment obtained from another vendor, even if the given rack is not full.

Furthermore, addition of an equipment item in a rack entails multiple separate actions, such as putting the item in place and/or affixing it to the rack, threading a data cable through existing cabling and connecting the item to a data device, and connecting a power cable to the item and to a power source. Each item installed in the rack must be separately attended to in terms of data, power, and/or any other required services, and those services cannot be fully connected ahead of time. Thus, replacement of one item (e.g., due to failure) involves several disconnections (e.g., of data and power links) and then corresponding reconnections.

DETAILED DESCRIPTION

Figure 1:
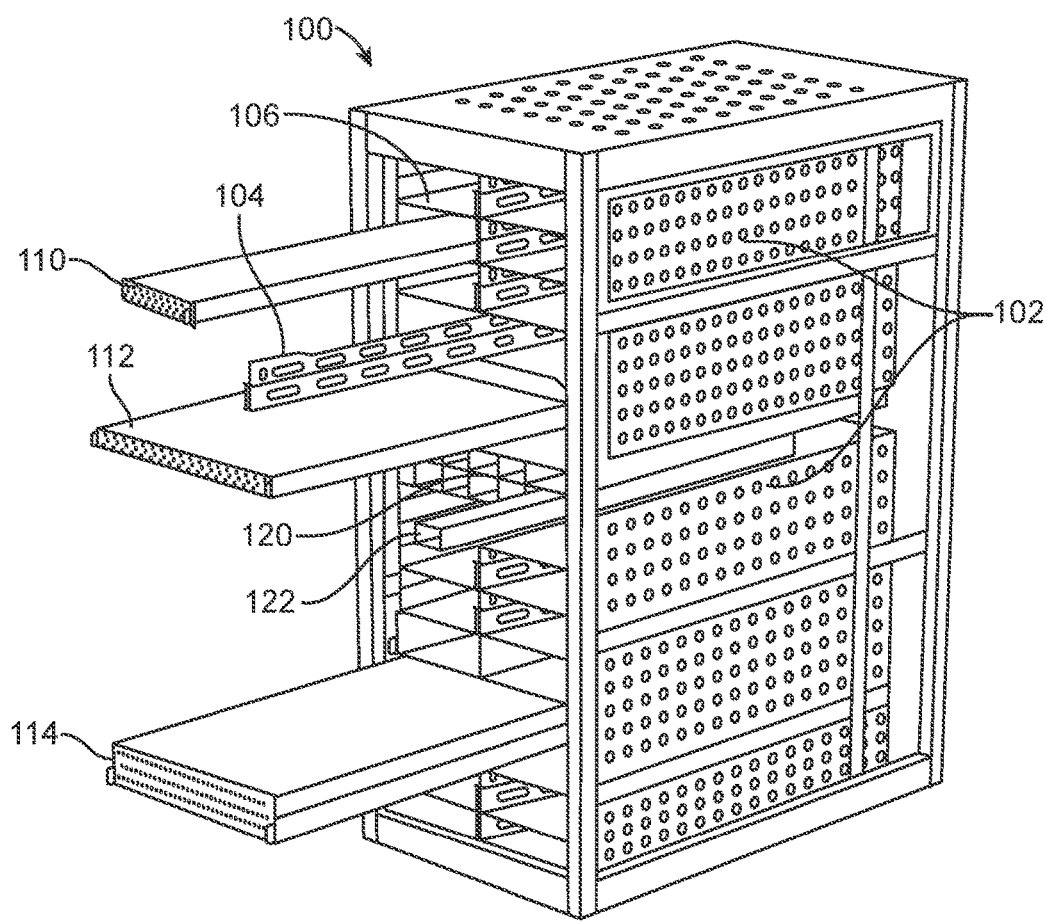
FIG. 1 is a block diagram depicting an equipment rack configured in accordance with some embodiments.

The following description is presented to enable any person skilled in the art to make and use the disclosed embodiments, and is provided in the context of one or more particular applications and their requirements. Various modifications to the disclosed embodiments will be readily apparent to those skilled in the art, and the general principles defined herein may be applied to other embodiments and applications without departing from the scope of those that are disclosed. Thus, the present invention or inventions are not intended to be limited to the embodiments shown, but rather are to be accorded the widest scope consistent with the disclosure.

In some embodiments, a flexible architecture for a data center equipment rack or rack system is provided. More particularly, a virtual chassis is provided that enables the rack to be flexibly and dynamically modified to accommodate a desired configuration of computer servers, communication devices (e.g., network switches), storage devices (e.g., solid state drives or SSDs, storage nodes), and/or other equipment. The dynamic, flexible nature of the architecture allows the rack to be installed and configured with necessary services (e.g., data connections, power connections) prior to identification and installation of a desired mix of equipment to reside in the rack, thereby significantly expediting the process of installing (or removing) a given equipment item.

Components of the architecture may be removed, added, or adjusted to alter the number and/or type of equipment that can be accommodated by a rack. For example, one type or class of computer server (or other device) compatible with the architecture may have a first footprint or size, and a second type or class of computer server that is compatible with the architecture may have a second footprint different from the first footprint. Yet further, additional compatible types or classes of computer server may have further different footprints that differ from the first and second footprints. By revising the configuration of a rack as supported by the architecture, different numbers and mixes of these types of computer servers may be accommodated, which may be obtained from any available source (e.g., vendor), thereby eliminating any dependence upon a particular vendor.

In some embodiments, the architecture comprises one or more virtual chassis that are attached within a rack. Depending on the size of the rack (e.g., its height in rack units), any number (i.e., one or more) virtual chassis may be installed. Because of their flexible nature, the configuration of a virtual chassis may be revised any number of times as the demand for the data center's resources changes or, more specifically, as the desired configuration of the host rack changes. Because the virtual chassis is configured ahead of time with necessary services (e.g., data cabling, power cabling) in these embodiments, individual resources may be placed in operating conditions virtually as soon as they are installed in the chassis.

FIG. 1 is a block diagram depicting an equipment rack configured in accordance with some embodiments. The illustrative configuration of the rack and its components is in no way restrictive, and the configurations of different racks may vary to any degree.

In FIG. 1, rack 100 comprises at least two flexible or virtual chassis 102. They may be considered virtual in nature because their configurations are not fixed as are the configurations of traditional chassis. Instead, the number and/or type of components stored in a chassis 102 can vary from rack to rack and even from one chassis 102 to another chassis 102 in the same rack. Each virtual chassis 102 includes two side walls, which may be parallel to side walls of rack 102, and a rear wall (not shown in FIG. 1), and may include bottoms and/or tops as well.

The configuration of a chassis 102 can be altered by adding and/or removing one or more removable partitions. In the illustrated embodiments, the removable partitions include one or more vertical dividers 104 and/or one or more horizontal dividers 106. As shown in FIG. 1, a vertical divider 104 is a vertically oriented removable component of chassis 102 that separates horizontally adjacent equipment items (or cells for installing equipment items), while horizontal divider 106 is a horizontally oriented component that separates vertically adjacent equipment items (or cells for installing equipment items). Vertical divider 104 may be (approximately) 1 RU in height (i.e., 1.75"); a horizontal divider may be approximately the width of chassis 102 or, in some implementations, may be approximately half the width of chassis 102. In other implementations, a vertical divider may be of a different height, and a horizontal divider may be of a different width.

By configuring the dividers as desired, cells or divisions of various dimensions or form factors may be defined. For example, brick 110 may represent the smallest form factor available for one particular type of equipment (e.g., computer servers) that may be installed in a chassis. Illustratively, brick 110 is 1 RU in height and is approximately half the width of chassis 102.

As another example, double-wide brick 112 occupies approximately the entire width of chassis 102, after removal of a vertical divider 104 if necessary. The space in which double-wide brick 112 is installed could otherwise be occupied by two side-by-side bricks 110, and therefore may be 1 RU in height.

As yet another example, quadruple brick 114 occupies a space in which four bricks 110 could be situated, by removal of a vertical divider 104 and a horizontal divider 106 if necessary. Quadruple brick 114 is approximately the width of chassis 102, and may be 2 RU in height, and may alternatively be termed a double-wide double-high brick.

Yet other form factors are within the scope of the illustrated embodiments. For example, a double-high brick could have the same width as brick 110 and the same height as quadruple brick 114. Similarly, a sextuple brick could have a shape substantially equivalent to six bricks 110.

Data distribution device 120 (e.g., a network switch) and power distribution device 122 (e.g., a power switch) may be installed from the front or a rear of rack 100, and may be installed inside a virtual chassis, or outside of a virtual chassis but within rack 100.

One of ordinary skill in the art will appreciate that the flexibility provided by virtual chassis 102 allows for a wide variety in terms of the sizes, dimensions, or form factors of computing devices and/or other equipment to be installed in rack 100. Based on the desired processing power to be provided by a physical rack (or, as described below, a virtual rack), or the desired amount of some other resource, a chassis 102 within rack 100 may be fully populated, sparsely populated, or may be configured somewhere in between.

To enhance the chassis' flexibility, some or all cells may be preconfigured with data, power, and/or other services. Thus, in some embodiments, to allow a virtual chassis 102 to be completely populated with equipment matching the form factor of brick 110 (e.g., 1 RU in height and half the width of the virtual chassis), as shown below, each cell that would result from a full complement of vertical and horizontal dividers (104, 106), has data and/or power cables prepositioned (i.e., connected to a rear of the chassis). If one or more of the vertical and/or horizontal dividers are removed—to allow installation of an equipment item having a different (e.g., larger) form factor—that equipment item will connect to multiple data and/or power connectors automatically when it is installed. In particular, the equipment item can connect automatically to all data and/or power connectors that were prepositioned for equipment matching the form factor of brick 110.

Figure 2A:
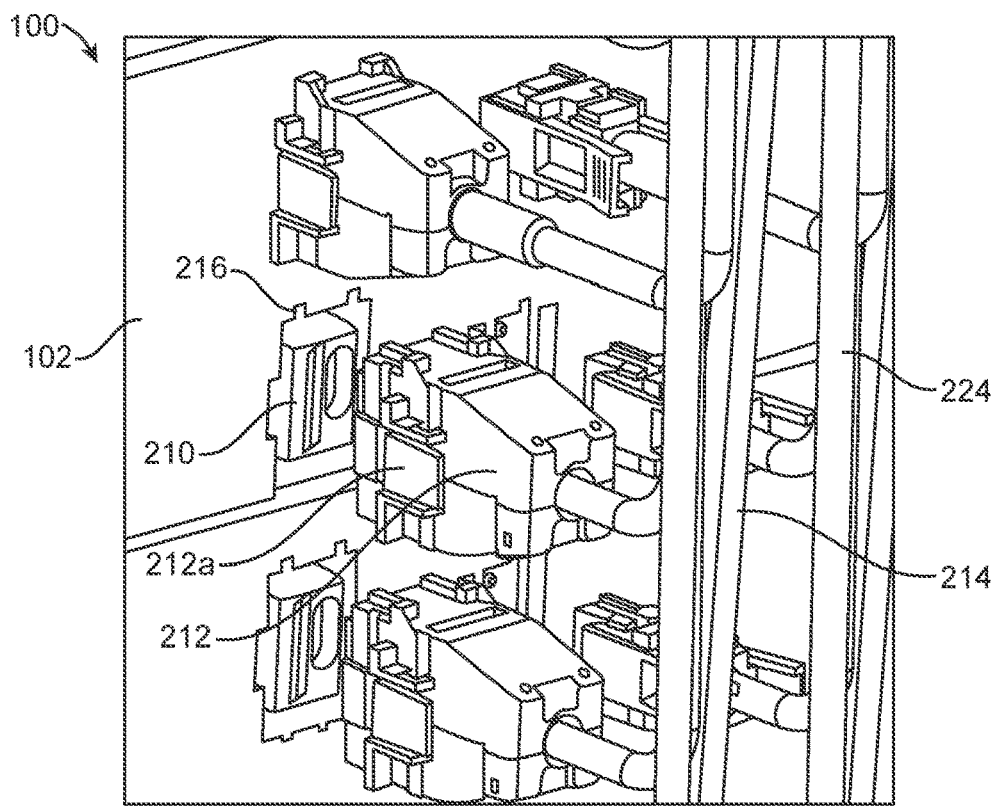
FIGS. 2A-B illustrate the rear of an equipment rack configured in accordance with some embodiments.
Figure 2B:
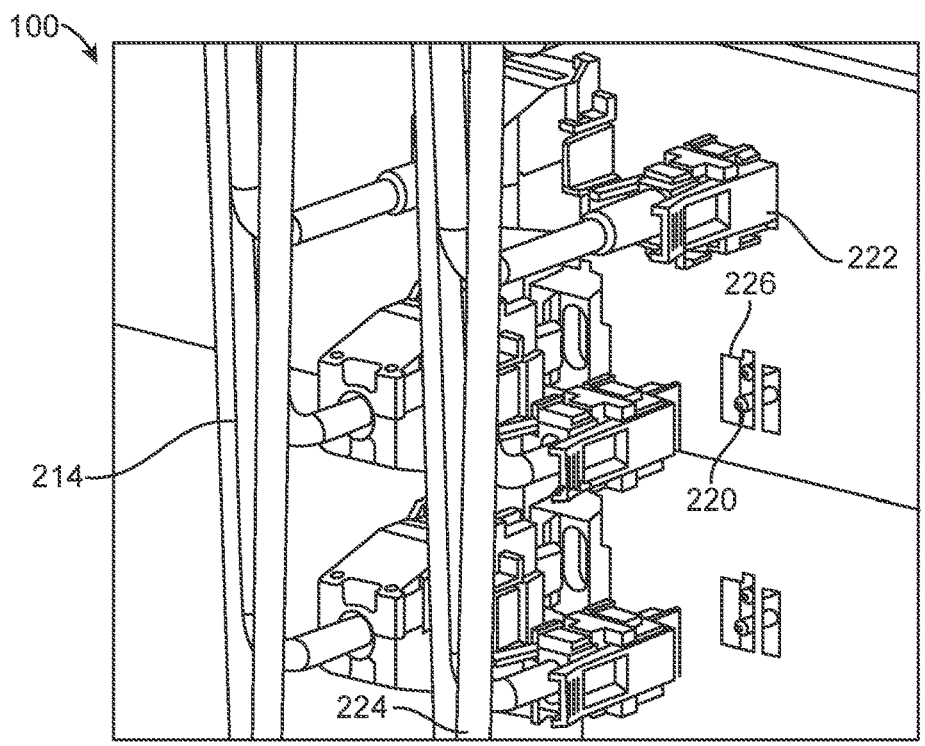

FIGS. 2A-B illustrate the rear of an equipment rack configured in accordance with some embodiments.

FIG. 2A depicts data port 210 of an electronic device (e.g., a computer server), which mates with data connector 212. Data connector 212 is connected to data cable 214, which may be coupled to a network switch, a router, a gateway, or other data communication equipment.

In some embodiments, data connector 212 connects in a snap-on or blind-mate manner with the illustrated rear wall of chassis 102 or, more particularly, with data cut-out 216 of chassis 102, which may feature a shape unique to a particular type or class of data connection (e.g., 10 Gbps, 100 Gbps). For example, the two notches at the top of cut-out 216 may admit only connectors of the same type/configuration as data connector 212, while tab 212a of the data connector mates with the side notch of data cut-out 216. In these embodiments, therefore, the data cabling and connectors may be installed before rack 100 and chassis 102 are populated with equipment, by connecting each data connector 212 to a corresponding data cut-out 216.

As individual devices are emplaced, via a front of rack 100 as shown in FIG. 1, each data port 210 of each device automatically mates with a corresponding data connector 212, without having to manually plug-in each data connector after the device is put in place. Similarly, a device may be removed from the rack without first disconnecting the corresponding data connector(s) from the corresponding data cut-out(s). Thus, in the illustrated embodiments, rear data connectors (and/or power connectors) blind-mate with a virtual chassis when no electronic equipment is yet installed. Subsequently, individual equipment items blind-mate with the data connectors (and/or power connectors).

FIG. 2B depicts power port 220 of an electronic device (e.g., a computer server), which mates with power connector 222. Power connector 222 is connected to power cable 224, which may be coupled to a power distribution unit or other type of power supply.

In some embodiments, power connector 222 connects in a snap-on or blind-mate manner with chassis 102 or, more particularly, with power cut-out 226 of chassis 102, which may be configured to accept only power connectors of a particular type, class, or configuration. In these embodiments, therefore, the power cabling and connectors may be installed before rack 100 and chassis 102 are populated with equipment. As individual devices are emplaced, each power port 220 of each device automatically mates with a corresponding power connector 222, without having to manually plug-in each power connector after the device is put in place. Similarly, a device may be removed from the rack without first disconnecting the corresponding power connector(s) from the corresponding power cut-out(s).

Thus, installation of a new computer server or other item simply requires insertion of the server into a suitable cell, double-wide cell, or quadruple cell (or yet another type of cell in other embodiments), and data and power services are immediately connected at the same time. This may include connection of multiple data and/or power connectors (e.g., for double-wide brick 112 or quadruple brick 114 of FIG. 1). Similarly, removal of an item (e.g., for replacement) is not delayed by first having to find and unplug data and/or power connectors at the rear of a virtual chassis. Cut-outs 216, 226 may alternatively be referred to as receptacles, attachment points, connector portals, and/or other terms.

FIGS. 3A-E illustrate the rear of a virtual chassis dynamically configured to accept equipment items having different footprints, in accordance with some embodiments.

Figure 3A:
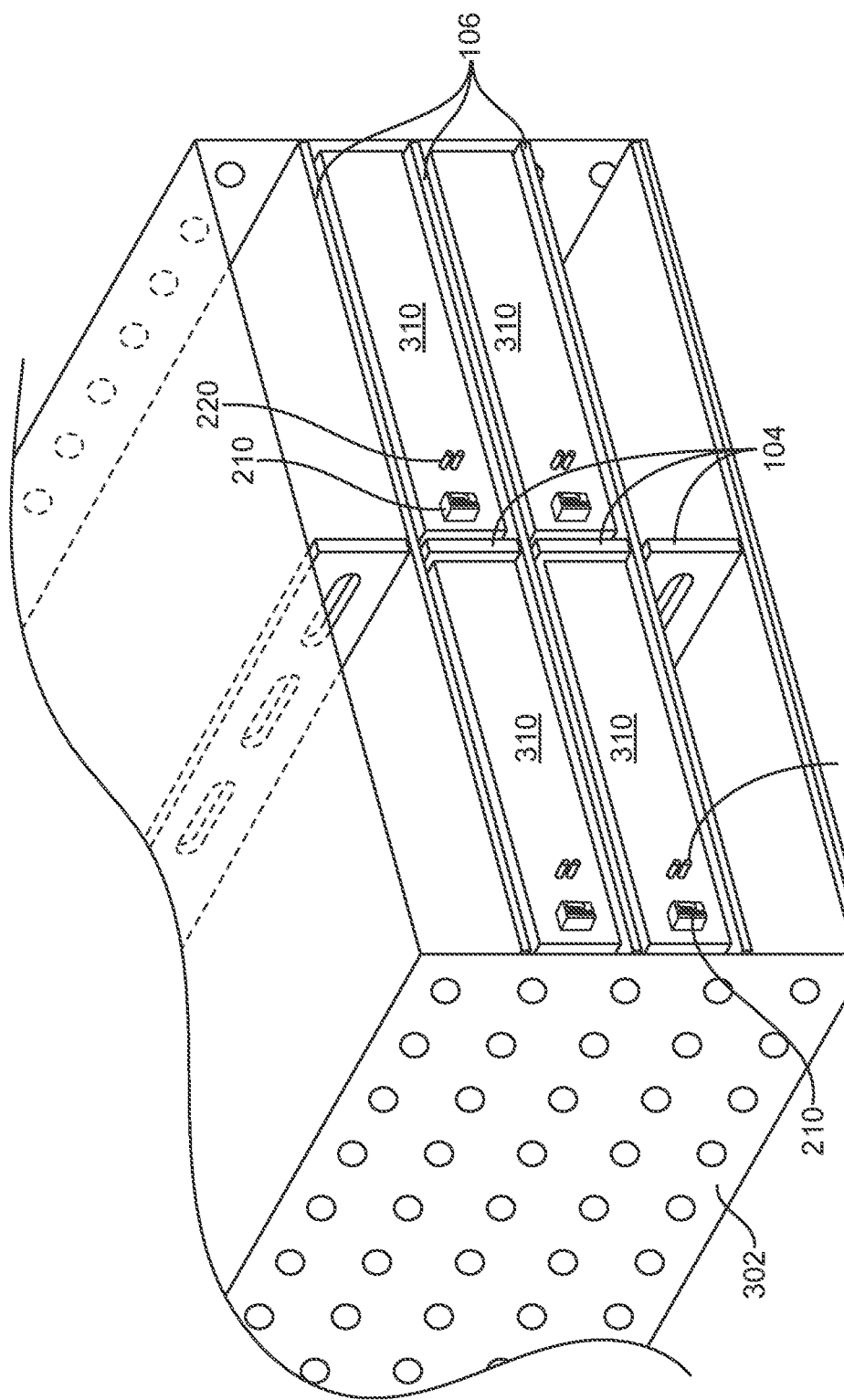
FIGS. 3A-E illustrate the rear of a virtual chassis dynamically configurable to accept equipment having different footprints, according to some embodiments.

In these embodiments, FIG. 3A shows a portion of chassis 302 configured to accommodate multiple equipment items matching or substantially conforming to the form factor of brick 110 of FIG. 1 (e.g., 1 RU high and approximately half the width of chassis 302). In particular, four bricks 310 are installed or are being installed in the chassis, separated by vertical and horizontal dividers (104, 106). Each brick 310 features a set of ports (i.e., one data port 210 and one power port 220) that will mate automatically with corresponding prepositioned data and power connectors (not shown in FIG. 3A) when the bricks are installed in the chassis. To promote clarity, a rear wall of chassis 302 is omitted from FIGS. 3A and 3B.

Although vertical dividers 104 are shown as (approximately) 1 RU tall, and horizontal dividers 106 are shown as (approximately) equal in width to chassis 302, in other embodiments one or more vertical dividers may be taller than 1 RU and/or one or more horizontal dividers may be narrower than the width of chassis 302.

Figure 3B:
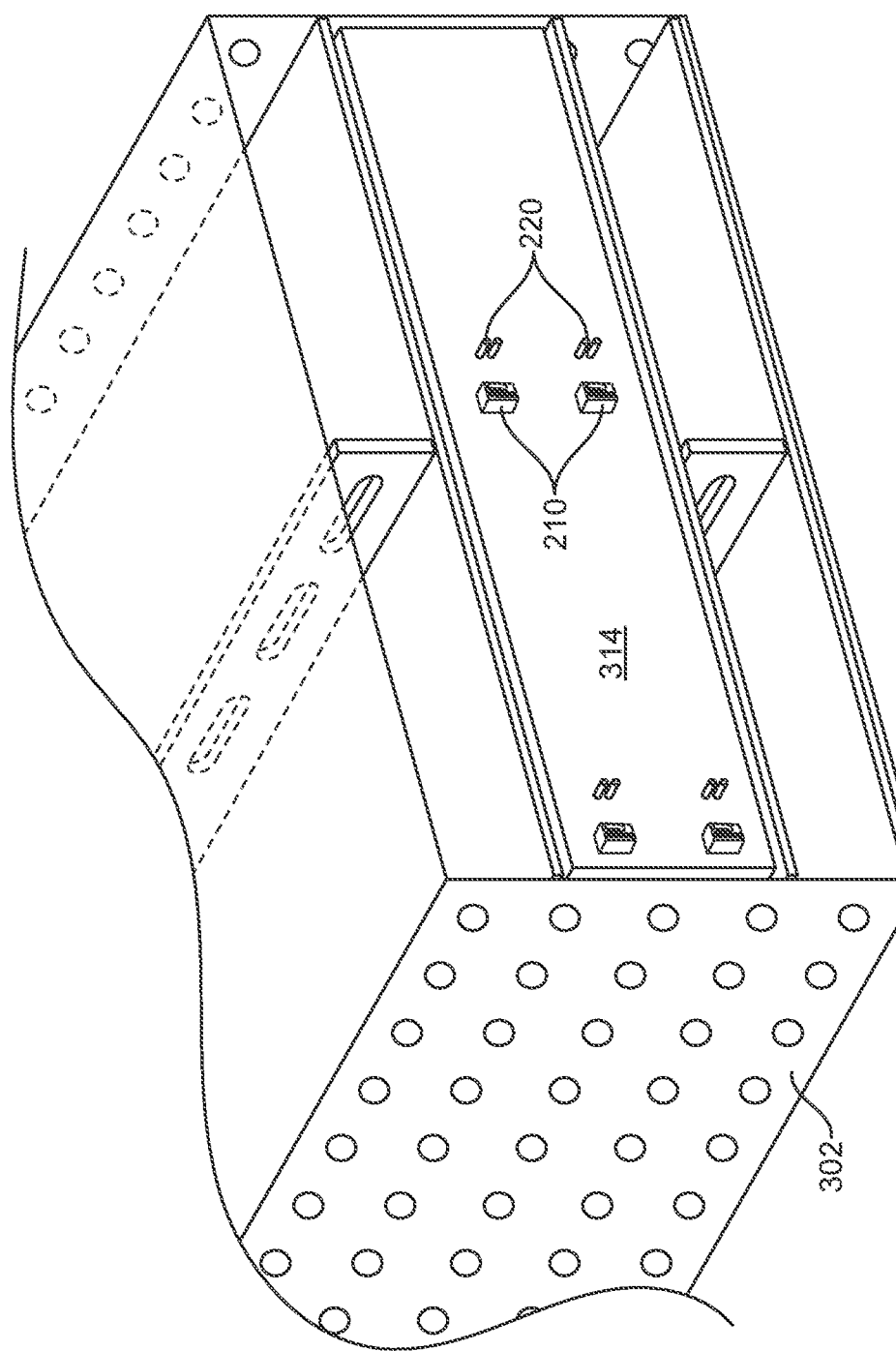

FIG. 3B shows the same portion of chassis 302 configured (or reconfigured) to accept a single equipment item matching or substantially conforming to the form factor of quadruple brick 114 of FIG. 1 (e.g., 2 RU high and approximately the width of chassis 302). For example, the four cells depicted in FIG. 3A may have been reconfigured to accept a single quadruple brick 314 by removing intervening horizontal and vertical dividers. Brick 314 features multiple (four) sets of data and power ports that will mate automatically with prepositioned data and power connectors (not shown in FIG. 3B) when the brick is installed in the chassis.

Figure 3C:
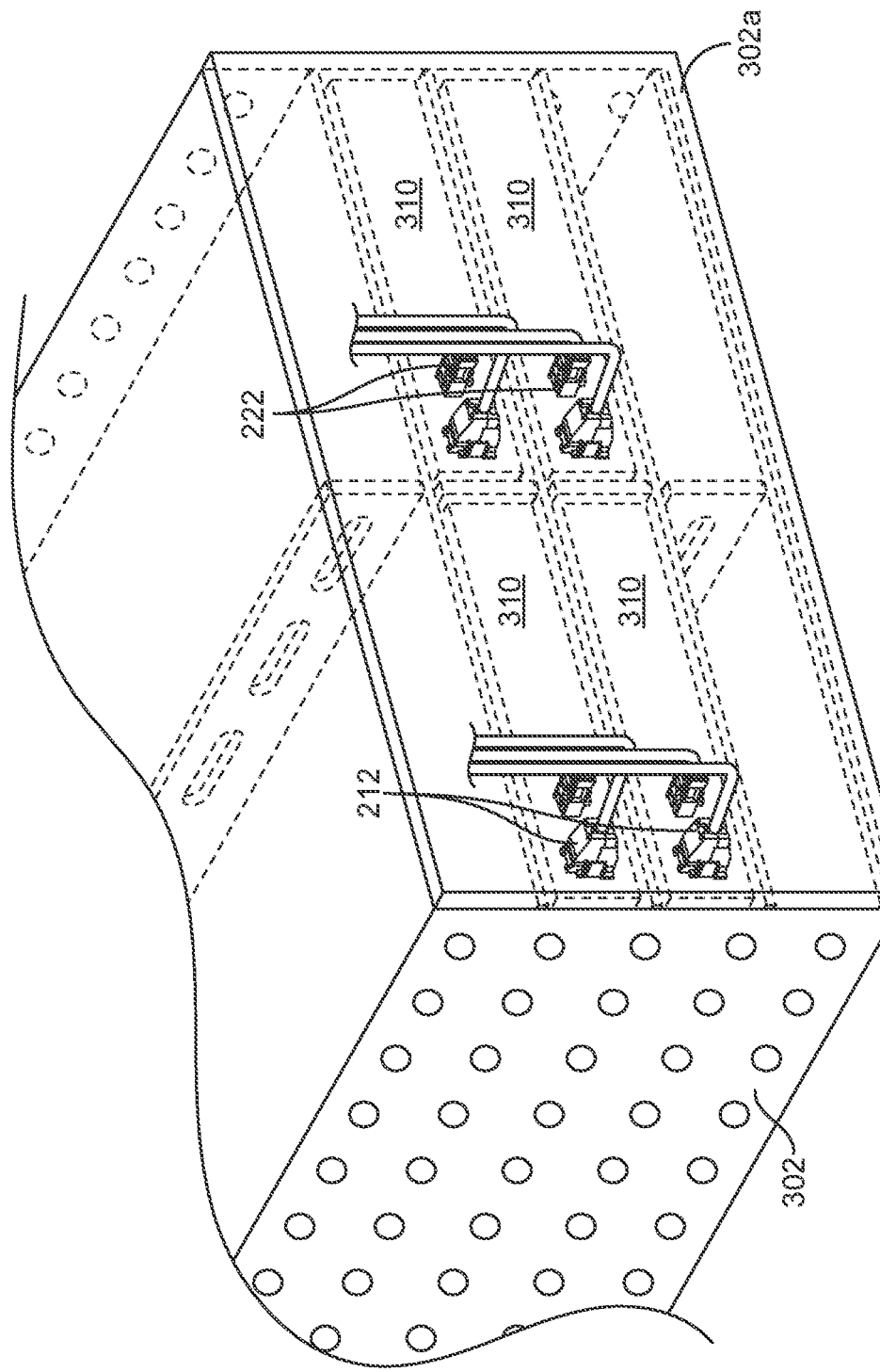

FIG. 3C corresponds to FIG. 3A, wherein four bricks 310 are installed in chassis 302, and illustrates the rear 302a of the chassis, including prepositioned data and power connectors (212, 222). In this configuration, the data and power ports (210, 220) of each brick 310 were automatically coupled to one set of the data and power connectors (i.e., one data connector 212 and one power connector 222) when the equipment items were installed.

Figure 3D:
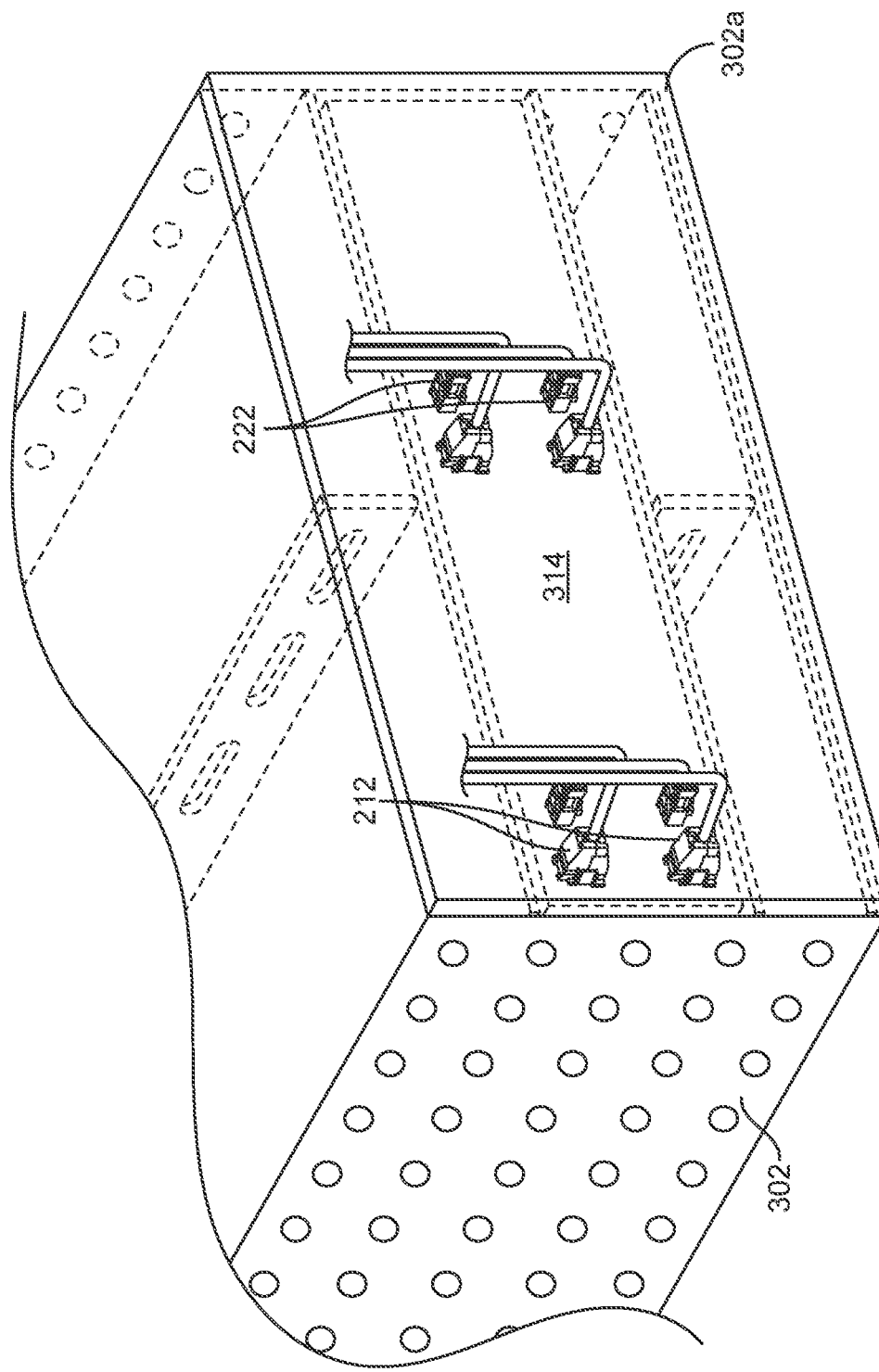

Similarly, FIG. 3D corresponds to FIG. 3B, wherein a single brick 314 is installed in chassis 302, and illustrates the rear 302a of the chassis, including prepositioned data and power connectors (212, 222). In the illustrated embodiment, all data and power ports (210, 220) of brick 314 were automatically coupled to the four illustrated sets of data and power connectors when the equipment item was installed.

Figure 3E:
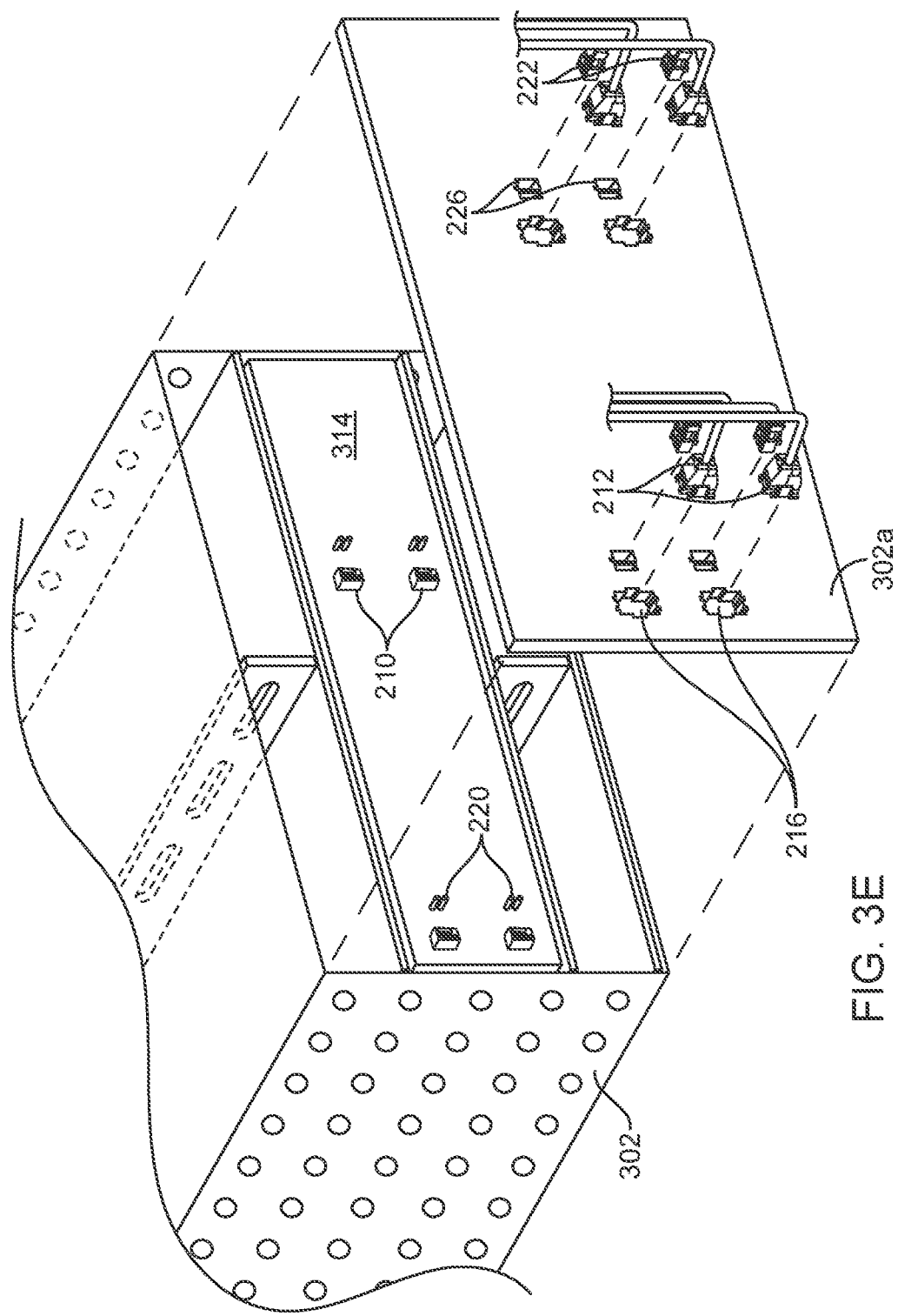

FIG. 3E is a composite illustration of chassis 302 as configured to accommodate a single brick 314. Data connectors 212 and power connectors 222 may be connected to corresponding data cutouts 216 and power cutouts 226 in rear wall 302a of chassis 302, prior to installation of brick 314. When the brick is installed, its corresponding data ports 210 and power ports 220 automatically mate with the prepositioned data and power connectors. When a single equipment item couples to multiple data/power connectors, one or more of the data and/or power connections may act as backup sources of data/power, or all connections may be engaged.

Figure 4:
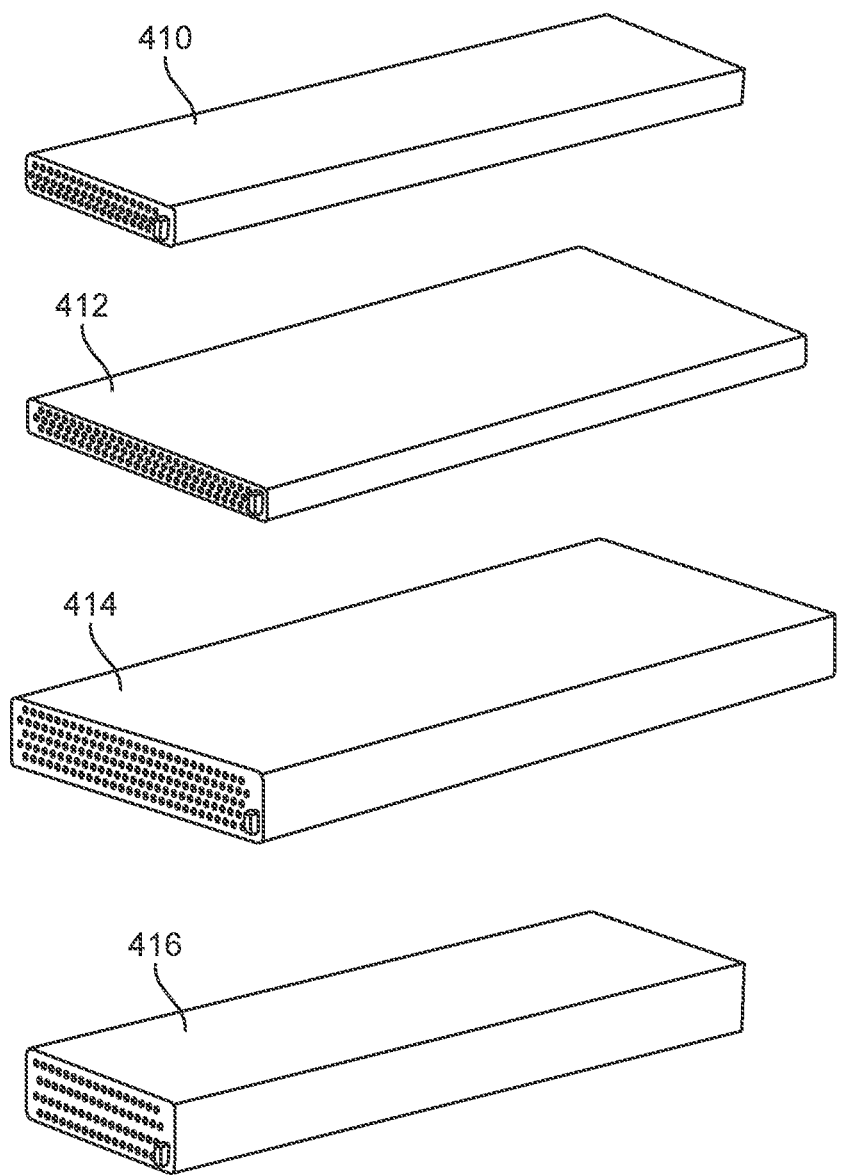
FIG. 4 depicts illustrative equipment for installing in an equipment rack in accordance with some embodiments.

FIG. 4 depicts illustrative equipment for installing in an equipment rack in accordance with some embodiments. In these embodiments, brick 410 is a single device (e.g., a computer server) with a first form factor having a first width and a first height. More specifically, brick 410 may correspond to brick 110 of FIG. 1, which may represent a standard-sized cell of chassis 102. In some implementations, brick 410 is 1 RU in height and approximately half the width of chassis 102, and features one set of data and power ports. When installed in chassis 102 of FIG. 1 in some embodiments, brick 410 automatically mates with one data connector and one power connector (which were pre-connected to a rear wall of the chassis).

Double-wide brick 412 is a single device (e.g., another computer server) with a second form factor having a second width and the first height. More specifically, double-wide brick 412 may correspond to double-wide brick 112 of FIG. 1, thus occupying two horizontally adjacent standard-sized cells of chassis 102. In some implementations, double-wide brick 312 is 1 RU in height and approximately the width of chassis 102, and may feature two sets of data and power ports. When installed in chassis 102 of FIG. 1 in some embodiments, brick 410 automatically mates with two data connectors and two power connectors (which were pre-connected to a rear wall of the chassis).

Quadruple brick 414 is a single device (e.g., another computer server) with a third form factor having the second width and a second height. More specifically, quadruple brick 414 may correspond to quadruple brick 114 of rack 100 of FIG. 1, thus occupying four horizontally and vertically adjacent standard-sized cells of chassis 102. In some implementations, quadruple brick 414 is 2 RU in height and approximately the width of chassis 102, and may feature multiple (e.g., four) sets of data and power ports. When installed in chassis 102, some or all of the data and power ports automatically mate with corresponding data connectors and power connectors (which were pre-connected to a rear wall of the chassis).

Yet other form factors may be employed, as discussed above, such as double-high brick 416 that matches the height of quadruple brick 414 and the width of brick 410, and which may feature multiple (e.g., two) sets of data and power ports.

In some embodiments, installation or configuration of a bare rack or rack system starts with installation of one or more virtual chassis (e.g., chassis 102 of FIG. 1) in the rack or rack system. For example, side walls and/or other surfaces of a virtual chassis may be attached to the rack system with screws, welds, hooks, and/or other attachment means. After the chassis is/are installed, data and/or power connectors may be affixed to any number of corresponding receptacles in a rear wall of a chassis (e.g., cut-outs 216, 226 of FIGS. 2A-B). The connectors may be considered separate from the chassis, at least until they are affixed to the receptacles. In some embodiments, data and power connectors are affixed to all receptacles in the chassis' rear wall.

Before and/or after data/power connectors are affixed to a chassis, the chassis may be configured with cells of multiple different dimensions by removing (and/or adding) partitions such as vertical divider(s) 104 and/or horizontal divider(s) 106 (shown in FIG. 1). After the chassis is configured (and data/power connectors affixed), one or more equipment items (e.g., computing devices, storage devices) are installed in the cells. As discussed above, when a given item is installed in an appropriately sized cell, its data and power connectors may automatically mate with one or more pairs of prepositioned data and power connectors.

Data distribution devices (e.g., switches) and/or power distribution devices may be installed within a chassis and/or within the rack but outside a chassis. Data and power cables attached to the connectors that were affixed to the chassis may be connected to the data and/or power devices at any point in the process of configuring a rack system and/or a virtual chassis. Thus, in some embodiments, a virtual chassis is completely configured with data and power services, along with appropriate vertical and horizontal dividers, such that the virtual chassis can accommodate a computer server (or other equipment item) of any compatible size and, when inserted into the chassis, it immediately powers up and becomes operational.

An environment in which one or more embodiments described above are executed may incorporate a general-purpose computer or a special-purpose device. Some details of such devices (e.g., processor, memory, data storage, display) may be omitted for the sake of clarity. A component such as a processor or memory to which one or more tasks or functions are attributed may be a general component temporarily configured to perform the specified task or function, or may be a specific component manufactured to perform the task or function. The term "processor" as used herein refers to one or more electronic circuits, devices, chips, processing cores and/or other components configured to process data and/or computer program code. A computer server or other computing or processing device installed in a virtual chassis may include any number of processors.

Any data structures and program code described in this detailed description are typically stored on a non-transitory computer-readable storage medium, which may be any device or medium that can store code and/or data for use by a computer system. Non-transitory computer-readable storage media include, but are not limited to, volatile memory; non-volatile memory; electrical, magnetic, and optical storage devices such as disk drives, magnetic tape, CDs (compact discs) and DVDs (digital versatile discs or digital video discs), solid-state drives, and/or other non-transitory computer-readable media now known or later developed.

Any methods and processes described in the detailed description can be embodied as code and/or data, which may be stored in a non-transitory computer-readable storage medium as described above. When a processor or computer system reads and executes the code and manipulates the data stored on the medium, the processor or computer system performs the methods and processes embodied as code and data structures and stored within the medium.

Furthermore, the methods and processes may be programmed into hardware modules such as, but not limited to, application-specific integrated circuit (ASIC) chips, field-programmable gate arrays (FPGAs), and other programmable-logic devices now known or hereafter developed. When such a hardware module is activated, it performs the methods and processed included within the module.

The foregoing embodiments have been presented for purposes of illustration and description only. They are not intended to be exhaustive or to limit this disclosure to the forms disclosed. Accordingly, many modifications and variations will be apparent to practitioners skilled in the art. The scope is defined by the appended claims, not the preceding disclosure.

What is claimed is:

1. A rack system, comprising:
    at least one virtual chassis installed in a rack, the virtual chassis comprising:
        at least three walls;
        one or more removable partitions defining multiple cells within the virtual chassis for receiving electronic equipment items; and
        multiple receptacles defined in one or more of the walls for receiving data connectors and/or power connectors to couple with the electronic equipment items;
    one or more data distribution devices; and
    one or more power distribution devices;
    wherein the multiple cells include:
        a first cell of a first width approximately equal to half a width of the virtual chassis and a first height approximately equal to one or more rack units;
        a second cell of a second width approximately equal to the width of the virtual chassis and of the first height; and
        a third cell of the second width and a second height that is approximately equal to a multiple of the first height.

2. The rack system of claim 1, wherein:
    the data connectors and the power connectors are connected to the data receptacles and the power receptacles, respectively, prior to installation of the electronic equipment items; and
    at least one electronic equipment item, when installed in a cell, mates with multiple data connectors and/or multiple power connectors.

3. The rack system of claim 1, wherein the one or more removable partitions include at least one of:
    a vertical divider that, when installed in the virtual chassis, separates two horizontally adjacent cells of the virtual chassis, and that is removable to transform the two horizontally adjacent cells into a first single cell; and
    a horizontal divider that, when installed in the virtual chassis, separates two vertically adjacent cells of the virtual chassis, and that is removable to transform the two vertically adjacent cells into a second single cell.

4. The rack system of claim 1, wherein one or more of the first cell, the second cell, and the third cell are populated with one of:
    a computing device; and
    a storage device.

5. The rack system of claim 1, wherein:
    each cell adjoins one or more of the multiple receptacles; and
    at least one receptacle adjoining each cell is connected to at least one data distribution device and at least one power distribution device prior to installation of an electronic equipment item in the cell.

6. The rack system of claim 1, wherein the virtual chassis further comprises:
    at least one of the one or more data distribution devices; and
    at least one of the one or more power distribution devices.

7. The rack system of claim 1, wherein:
    installation of a first electronic equipment item includes automatically connecting a first data port and a first power port of the first electronic equipment item to a first data connector and a first power connector, respectively.

8. A method of configuring a rack system, the method comprising:
    installing one or more virtual chassis in a rack, wherein each virtual chassis includes:
        at least three walls;
        one or more removable partitions; and
        multiple receptacles defined in one or more of the walls for receiving data connectors and/or power connectors;
        wherein the one or more removable partitions and the at least three walls define multiple cells into which electronic equipment items are installed;

coupling data connectors to a first plurality of the multiple receptacles, wherein the data connectors are coupled to one or more data distribution devices; and coupling power connectors to a second plurality of the multiple receptacles, wherein the power connectors are coupled to one or more power distribution devices;

wherein:

the data connectors are coupled to the data receptacles prior to installation of the electronic equipment items;

the power connectors are coupled to the power receptacles prior to installation of the electronic equipment items; and at least one electronic equipment item, when installed in a cell, mates with multiple data connectors and/or multiple power connectors.

9. The method of claim 8, wherein:

the one or more removable partitions define multiple cells within the virtual chassis for receiving the electronic equipment items; and two or more of the multiple cells are of different dimensions.

10. The method of claim 9, further comprising:

after said coupling data connectors and coupling power connectors, installing a first equipment item in a first cell of the multiple cells;

wherein installation of the first equipment item includes automatically connecting a first data port and a first power port of the first equipment item to a first data connector and a first power connector, respectively.

11. The method of claim 9, wherein the multiple cells include:

a first cell of a first width approximately equal to half a width of the virtual chassis and a first height approximately equal to one or more rack units;

a second cell of a second width approximately equal to the width of the virtual chassis and of the first height; and a third cell of the second width and a second height approximately equal to a multiple of the first height.

12. The method of claim 8, wherein the one or more removable partitions include at least one of:

a vertical divider that, when installed in the virtual chassis, separates two horizontally adjacent cells of the virtual chassis, and that is removable to transform the two horizontally adjacent cells into a first single cell; and a horizontal divider that, when installed in the virtual chassis, separates two vertically adjacent cells of the virtual chassis, and that is removable to transform the two vertically adjacent cells into a second single cell.

13. The method of claim 8, wherein at least one of the multiple cells is populated with one of:

a computing device; and a storage device.

14. The method of claim 8, wherein each virtual chassis further comprises:

at least one of the one or more data distribution devices; and at least one of the one or more power distribution devices.

15. A rack system, comprising:

at least one virtual chassis installed in a rack, each virtual chassis comprising:

at least two walls;

one or more removable partitions defining multiple cells within the virtual chassis for receiving electronic equipment items; and multiple receptacles defined in one or more of the walls for receiving data connectors and/or power connectors;

one or more data distribution devices coupled to the data connectors; and one or more power distribution devices coupled to the power connectors;

wherein:

the data connectors are coupled to the data receptacles prior to installation of the electronic equipment items;

the power connectors are coupled to the power receptacles prior to installation of the electronic equipment items; and at least one electronic equipment item, when installed in a cell, mates with multiple data connectors and/or multiple power connectors.

16. The rack system of claim 15, wherein the at least one electronic equipment item comprises:

multiple data ports for mating with the multiple data connectors; and multiple power ports for mating with the power connectors.

17. The rack system of claim 15, wherein two or more of the multiple cells are of different dimensions.

18. The rack system of claim 15, wherein the multiple cells include:

a first cell type of a first width approximately equal to half a width of the virtual chassis and a first height approximately equal to one or more rack units;

a second cell type of a second width approximately equal to the width of the virtual chassis and of the first height; and a third cell type of the second width and a second height approximately equal to a multiple of the first height.

19. The rack system of claim 18, wherein the cell in which the at least one electronic equipment item is installed is one of the second cell type and the third cell type.

20. The rack system of claim 15, wherein one or more of the multiple cells are populated with:

a computing device; or a storage device.

* * * * *